United States Patent
Moon et al.

(10) Patent No.: US 7,639,076 B2
(45) Date of Patent: Dec. 29, 2009

(54) GAIN CONTROLLED AMPLIFIER AND CASCODED GAIN CONTROLLED AMPLIFIER BASED ON THE SAME

(75) Inventors: Jae-joon Moon, Seoul (KR); Dae-gyu Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/186,272

(22) Filed: Aug. 5, 2008

(65) Prior Publication Data
US 2009/0033413 A1 Feb. 5, 2009

Related U.S. Application Data

(63) Continuation of application No. 11/348,256, filed on Feb. 7, 2006, now Pat. No. 7,417,499.

(30) Foreign Application Priority Data
Feb. 17, 2005 (KR) .............................. 2005-13262

(51) Int. Cl.
*H03G 3/20* (2006.01)
(52) U.S. Cl. ........................................ 330/86; 330/144
(58) Field of Classification Search .................. 330/86, 330/144, 282, 284
See application file for complete search history.

(56) References Cited

U.S. PATENT DOCUMENTS 5,034,699 A 7/1991 Powell 6,362,684 B1 * 3/2002 Klein et al. .................... 330/86
2007/0090875 A1 4/2007 McLachlan et al.

FOREIGN PATENT DOCUMENTS

JP 07-176964 A 3/1995
JP 2003-087068 3/2003

OTHER PUBLICATIONS

Korean Office Action issued Jul. 31, 2006 for Korean Patent Application No. 2005-13262.

* cited by examiner

*Primary Examiner*—Steven J Mottola
(74) *Attorney, Agent, or Firm*—Sughrue Mion, PLLC

(57) ABSTRACT

A gain controlled amplifier and a cascoded gain controlled amplifier based on the same are disclosed. The gain controlled amplifier includes an operational amplifier for amplifying an input signal, an input resistor connected to an input terminal of the operational amplifier, a feedback resistor connected to an output terminal of the operational amplifier, and a resistor circuit for providing voltages having different levels to the input terminal and the output terminal of the operational amplifier, respectively, according to a digital signal composed of specified bits. The gain controlled amplifier employs an R-2R ladder circuit controlled by a digital signal so as to obtain a gain that is in linear proportion to a decibel scale. Since the R-2R ladder circuit operates with a small resistance value, the chip size of the gain controlled amplifier can be reduced.

9 Claims, 4 Drawing Sheets

GAIN CONTROLLED AMPLIFIER AND CASCODED GAIN CONTROLLED AMPLIFIER BASED ON THE SAME

CROSS-REFERENCE TO RELATED APPLICATIONS

This application claims priority from Korean Patent Application No. 2005-13262, under 35 U.S.C. § 119 filed on Feb. 17, 2005, the entire content of which is incorporated herein by reference.

BACKGROUND OF THE INVENTION

1. Field of the Invention

The invention relates to a gain controlled amplifier and a cascoded gain controlled amplifier based on the same, and more particularly, to a gain controlled amplifier that can output a gain in linear proportion to a decibel scale through the control of a digital code, and a cascoded gain controlled amplifier that can output a gain having a broadband dynamic range based on the gain controlled amplifier.

2. Description of the Related Art

A gain controlled amplifier (GCA) is a device that can vary an amplification degree thereof in accordance with a control signal. Such a gain controlled amplifier is generally provided in an RF processing circuit of a DVD recorder and is applied to various application fields that require gain compensation. For example, it is used to compensate for a loss of transmission lines or to control a gain that is in linear proportion to a decibel scale.

It is difficult to obtain gain that is in linear proportion to a decibel scale in a CMOS type operational amplifier. Conventional techniques for solving the above drawback will now be explained.

FIG. 1 is a circuit diagram illustrating the construction of an operational amplifier using a resistance network disclosed in U.S. Pat. No. 4,292,596, entitled "Gain Control Circuit" issued to Ishizuka et al., on Sep. 29, 1981.

Referring to FIG. 1, the operational amplifier disclosed in the Ishizuka et al. patent consists of a plurality of switches and resistors, and obtains a gain that is in linear proportion to a decibel scale by adjusting an input/output resistance thereof. However, the operational amplifier has the problems that the whole chip size is increased due to an increase of the resistance and thus the power consumption is also increased. Additionally, since the resistors are floated when the switches are turned off, the circuit becomes in a very unstable state.

FIG. 2 is a circuit diagram illustrating the construction of "Digitally Programmable Decibel-Linear CMOS VGA for Low-Power Mixed-Signal Applications" disclosed in IEEE Trans. Circuit and Syst.—II, May 2000.

Referring to FIG. 2, a CMOS variable gain amplifier (VGA) operates so that an electric current outputted from a current division network (CDN) becomes linear in proportion to a decibel scale. However, the CMOS VGA has the problem that it should employ two amplifiers so as to convert voltage into current and then to convert the converted current into voltage again.

SUMMARY OF THE INVENTION

The present invention has been developed in order to solve the above drawbacks and other problems associated with the conventional arrangement. An aspect of the present invention is to provide a gain controlled amplifier which can output a gain that has a broadband dynamic range in linear proportion to a decibel scale and reduce a chip size and power consumption, and a cascoded gain controlled amplifier based on the gain controlled amplifier.

The foregoing and other objects and advantages are substantially realized by providing a gain controlled amplifier, according to the present invention, which comprises an operational amplifier for amplifying an input signal, an input resistor connected to an input terminal of the operational amplifier, a feedback resistor connected to an output terminal of the operational amplifier, and a resistor circuit for providing voltages having different levels to the input terminal and the output terminal of the operational amplifier, respectively, according to a digital signal composed of specified bits.

The resistor circuit may be an R-2R ladder circuit.

The voltage gain of the operational amplifier may be varied by the voltages of the different levels provided from the R-2R ladder circuit to the input terminal and the output terminal of the operational amplifier.

The voltage gain of the operational amplifier may be linear in proportion to a decibel scale.

The resistance of the R-2R ladder circuit may be combined with the input resistance and the feedback resistance of the operational amplifier according to the digital signal of n bits, so that the overall input resistance and the overall feedback resistance of the operational amplifier are varied.

By adjusting values of the input resistance and the feedback resistance of the operational amplifier, the range of the gain of the operational amplifier can be varied, and by adjusting the bit number of the digital signal that is applied to the resistor circuit, desired gain steps can be obtained.

The R-2R ladder circuit may include first resistors and second resistors connected together to form the ladder circuit, and a plurality of switching elements connected to the second resistors, respectively, wherein if the digital signal of a first logic level is applied to the switching elements, the second resistors are connected to the input terminal of the operational amplifier, and if the digital signal of a second logic level is applied to the switching elements, the second resistors are connected to the output terminal of the operational amplifier.

In another aspect of the present invention, there is provided a cascoded gain controlled amplifier which comprises a gain controlled amplifier for outputting a gain value of a dynamic range according to a digital signal of specified bits, an operational amplifier for outputting a fixed gain value, and a multiplexer for outputting the gain value of the gain controlled amplifier if the most significant bit (MSB) of the digital signal is "0", and outputting the sum of the gain value of the gain controlled amplifier and the gain value of the operational amplifier if the MSB of the digital signal is "1".

The gain controlled amplifier and the operational amplifier may be connected in a cascoded manner.

The MSB of the digital signal may be used to control the multiplexer, and the remaining bits thereof may be used to control the gain value of the gain controlled amplifier.

In still another aspect of the present invention, there is provided a cascoded gain controlled amplifier which comprises a gain controlled amplifier which outputs a gain value of a dynamic range according to a digital signal of desired bits, first and second operational amplifiers for outputting different fixed gain values, and a multiplexer for outputting the sum of the gain value of the gain controlled amplifier and the gain value of the first operational amplifier if the MSB of the digital signal is "0", and outputting the sum of the gain value of the gain controlled amplifier and the gain value of the second operational amplifier if the MSB of the digital signal is "1".

The first and second operational amplifiers may be connected to each other in parallel.

The gain controlled amplifier may be connected to the operational amplifiers in a cascoded manner.

The MSB of the digital signal may be used to control the multiplexer, and the remaining bits thereof may be used to control the gain value of the gain controlled amplifier.

BRIEF DESCRIPTION OF THE DRAWINGS

The above aspects and features of the present invention will be more apparent by describing exemplary embodiments of the present invention with reference to the accompanying drawings, in which.

DETAILED DESCRIPTION OF EXEMPLARY EMBODIMENTS

Figure 1:
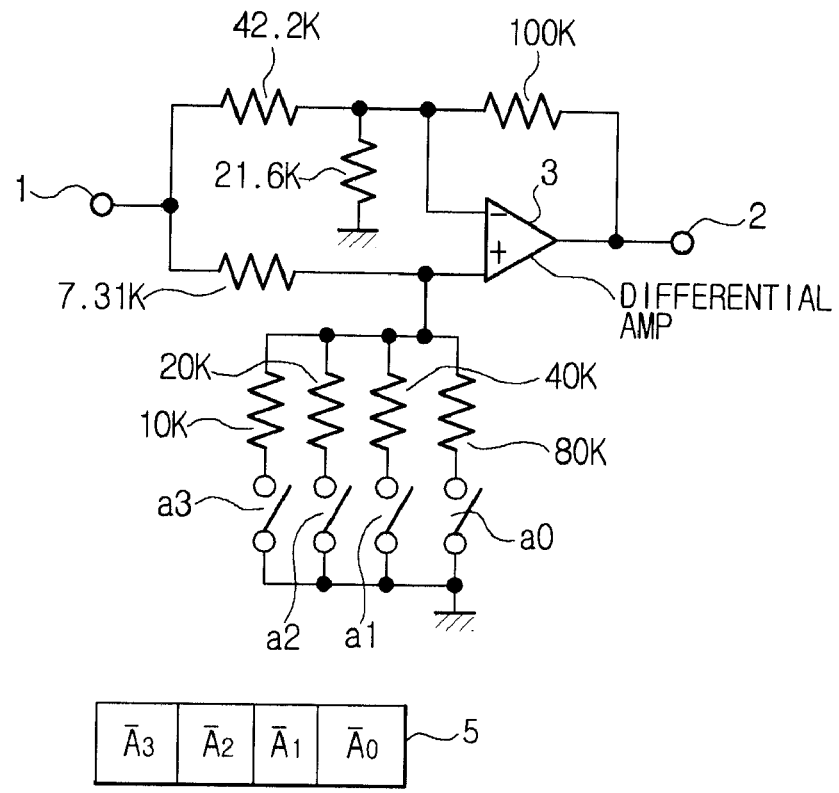
FIG. 1 is a circuit diagram illustrating the construction of an operational amplifier using a resistance network disclosed in U.S. Pat. No. 4,292,596.
Figure 2:
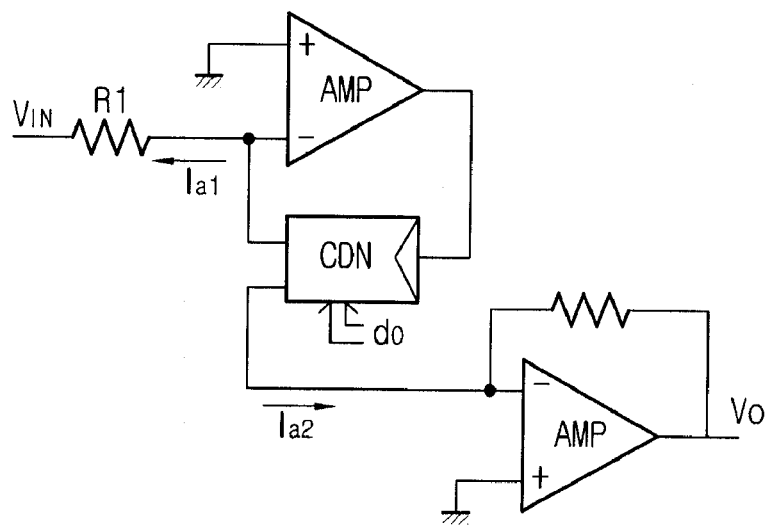
FIG. 2 is a circuit diagram illustrating the construction of "Digitally Programmable Decibel-Linear CMOS VGA for Low-Power Mixed-Signal Applications" disclosed in IEEE Trans. Circuit and Syst.—II, May 2000.

Certain exemplary embodiments of the present invention will be described in greater detail with reference to the accompanying drawings.

In the following description, same drawing reference numerals are used for the same elements even in different drawings. The matters defined in the following description, such as a detailed construction and elements, are provided to assist in a comprehensive understanding of the invention as exemplary embodiments. Thus, it is apparent that the present invention can be carried out without those defined matters. Also, well-known functions or constructions are not described in detail since they would obscure the invention in unnecessary detail.

Figure 3:
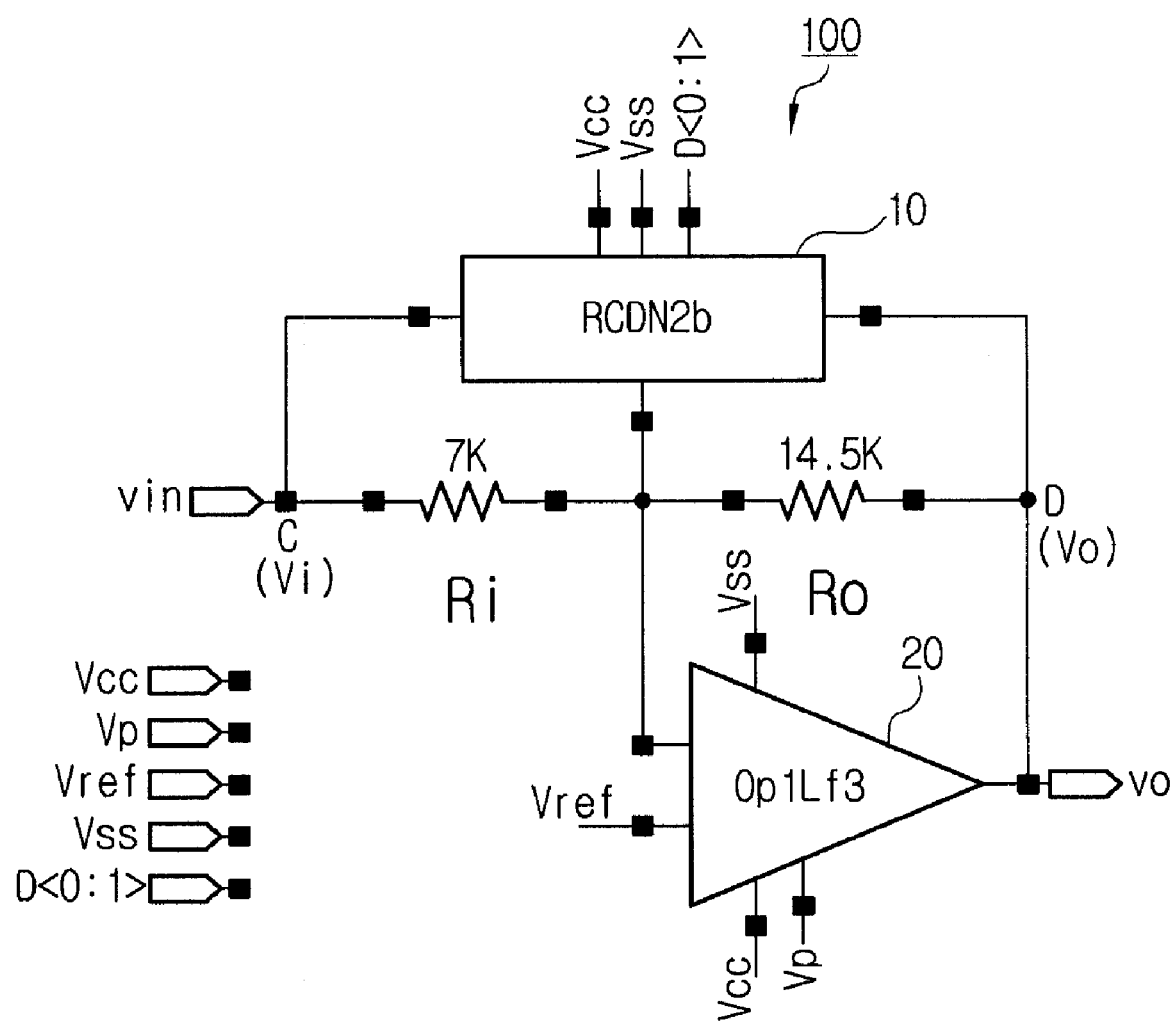
FIG. 3 is a circuit diagram illustrating the construction of a gain controlled amplifier according to an exemplary embodiment of the present invention.

FIG. 3 is a circuit diagram illustrating the construction of a gain controlled amplifier according to an exemplary embodiment of the present invention. Referring to FIG. 3, the gain controlled amplifier (GCA) 100 includes an R-2R ladder circuit 10, an input resistor Ri, a feedback resistor Ro, and an operational amplifier 20.

The R-2R ladder circuit 10 outputs voltages of different levels to input and output terminals of the operational amplifier 20 according to a digital signal of n bits applied from an outside circuit or source. FIGS. 4a through 4d are circuit diagrams illustrating the exemplary embodiments of construction of the R-2R ladder circuit in FIG. 3 when the digital signal of n bits is applied thereto.

Figure 4A:
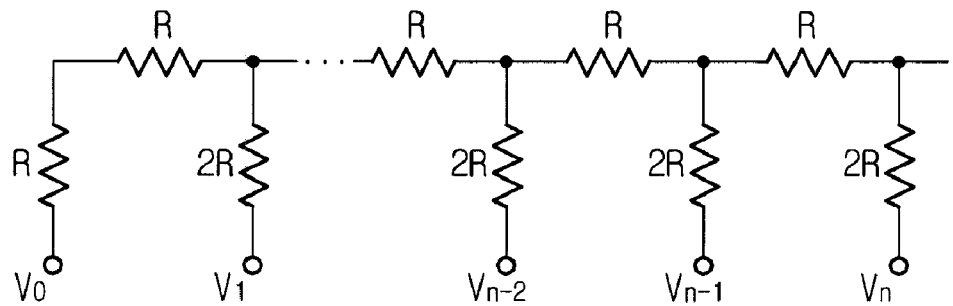
FIGS. 4a to 4d are circuit diagrams illustrating the construction of the R-2R ladder circuit in FIG. 3 when a digital signal of n bits is applied thereto.

Referring to FIG. 4a, the R-2R ladder circuit 10 has a plurality of first resistors R and second resistors 2R which are connected together to form the ladder circuit, and a plurality of switching elements (not illustrated) connected to the second resistors 2R, respectively. If a digital signal of a first logic level is applied to the switching elements, the second resistors 2R are connected to the input terminal (e.g., node C) of the operational amplifier 20, and if a digital signal of a second logic level is applied to the switching elements, the second resistors 2R are connected to the output terminal (e.g., node D) of the operational amplifier 20.

Specifically, a node $v_0$ is connected to the node C of FIG. 3, and the first through n-th nodes $v_1, \ldots, v_{n-2}, v_{n-1}$, and $v_n$ are switched to be connected to the node C or D as shown in FIG. 3 according to the digital signal applied to the R-2R ladder circuit 10. In this case, the switching of the nodes is performed by a multiplexer (not illustrated) connected to the first through n-th nodes $v_1, \ldots, v_{n-2}, v_{n-1}$, and $v_n$.

One example of the switching operation is described in Table 1. Referring to Table 1, if a digital signal of two bits is applied to the R-2R ladder circuit 10, the first through n-th nodes are switched to be connected to the node C or D.

TABLE 1

An Example of Switching Operation of Nodes

| Digital Signal | First Node v1 | Second Node v2 |
|---|---|---|
| 00 | 0→ connected to Node D | 0→ connected to Node D |
| 01 | 0→ connected to Node D | 1→ connected to Node C |
| 10 | 1→ connected to Node C | 0→ connected to Node D |
| 11 | 1→ connected to Node C | 1→ connected to Node C |

Referring to Table 1, if the digital code "0" is applied to the first node $v_1$ and the second node $v_2$, the first node $v_1$ and the second node $v_2$ are switched to be connected to the node D of FIG. 3 by the multiplexer (not illustrated). If the digital code "1" is applied to the first node $v_1$ and the second node v2, the first node v1 and the second node v2 are switched to be connected to the node C of FIG. 3 by the multiplexer. However, the present invention is not limited to the above-described example. The multiplexer may be implemented to operate in a manner that if the digital code "0" is applied to the respective nodes, the nodes are switched to be connected to the node C of FIG. 3, while if the digital code "1" is applied to the respective nodes, the nodes are switched to be connected to the node D of FIG. 3.

In the R-2R ladder circuit 10, the voltage at the node A is a component that the voltages of the respective nodes $v_1, \ldots, v_{n-2}, v_{n-1}$, and $v_n$ contribute to the node A according to the principle of superposition. This component of contribution may be expressed by the Thevenin's equivalent circuit as illustrated in FIGS. 4b to 4d.

Figure 4B:
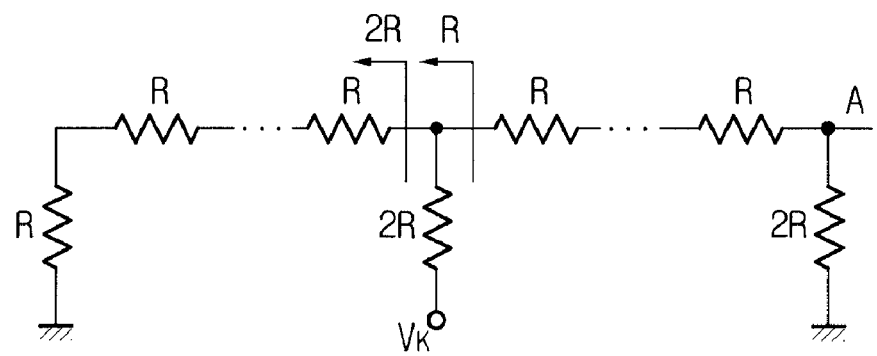
Figure 4C:
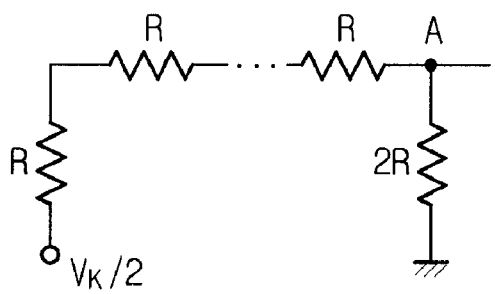
Figure 4D:
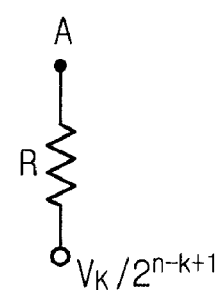

Referring to FIGS. 4b to 4d, the contributed voltages $V_{A(K)}$ of the respective nodes that appear at the node A are expressed by Equation (1).

$$v_{A(n)} = \frac{v_n}{2} \tag{1}$$

$$v_{A(n-1)} = \frac{v_{n-1}}{2^2}$$

$$O$$

$$v_{A(0)} = \frac{v_o}{2^{n+1}}$$

According to the principle of superposition, the voltage at the node A refers to the sum of the respective contributed voltages, and thus the voltage at the node A is expressed by Equation (2).

$$v_A = \sum_{k=0}^{n} \frac{v_k}{2^{n-k+1}} \quad (2)$$

Referring to Equations (1) and (2), if $v_A=0$ and the voltages at the respective nodes $v_1, \ldots, v_{n-2}, v_{n-1}$, and $v_n$ are divided into two inputs of the nodes C and D, Equation (2) is modified as Equation (3).

$$0 = \sum_{k=0}^{n} \frac{v_i}{\overline{a_k} 2^k} + \sum_{k=0}^{n} \frac{v_o}{a_k 2^k} \quad (3)$$

In Equation (3), $a_k$ has a value of "1" or "0", and $\overline{a_k}$ has a value opposite to the value of $a_k$. That is, if $a_k$ is "1", $\overline{a_k}$ is "0", while if $a_k$ is "0", $\overline{a_k}$ is "1". In Equation (3), $v_i$ denotes a voltage at the input node C, and $v_o$ denotes a voltage at the output node D.

The voltage gain of the gain controlled amplifier 100 calculated from Equation (3) is expressed as Equation (4).

$$A_v = \frac{v_o}{v_i} = \frac{\sum_{k=0}^{n} a_k 2^k}{\sum_{k=0}^{n} \overline{a_k} 2^k} = -\frac{R'_o}{R'_i} \quad (4)$$

In Equation (4), $A_v$ denotes the voltage gain of the gain controlled amplifier 100, $v_o$ denotes the voltage at the output node D, $v_i$ denotes the voltage at the input node C, $R_{o'}$ denotes the overall feedback resultant resistance of the gain controlled amplifier 100, and $R_{i'}$ denotes the overall input resultant resistance of the gain controlled amplifier 100.

The resistance of the R-2R ladder circuit 10 is combined with the input resistance Ri of the operational amplifier 20 and the feedback resistance Ro of the operational amplifier 20 by the digital signal of n bits applied to the R-2R ladder circuit 10, so that the overall input resistance Ri' and the overall feedback resistance Ro' of the operational amplifier 100 are produced. In general, the gain of the operational amplifier is expressed as a ratio of the input resistance to the feedback resistance. In this exemplary embodiment, the overall input resistance Ri' and the overall feedback resistance Ro' of the gain controlled amplifier 100 are varied by the R-2R ladder circuit 10, and thus the gain of the gain controlled amplifier 100 is varied.

Also, by adjusting the input resistance Ri and the feedback resistance Ro of the operational amplifier 20, the overall input resistance Ri' and the overall feedback resistance Ro' of the gain controlled amplifier 100 are varied, and thus the dynamic range of the gain Av and gain steps desired by a user can be obtained.

In FIG. 4, if the digital signal of two bits is applied to the R-2R ladder circuit 10, the input resistance Ri of the operational amplifier 20 is adjusted to 10 KΩ, and the feedback resistance Ro of the operational amplifier 20 is adjusted to 14.5 KΩ, the voltage gain and the cutoff frequency of the gain controlled amplifier 100 are given in Table 2.

TABLE 2

Voltage Gain and Cutoff Frequency of Gain Controlled Amplifier

| Digital Signal | Voltage Gain Av (dB) | Cutoff Frequency (MHz) |
| --- | --- | --- |
| 00 | −0.1 | 13.2 |
| 01 | 2.7 | 10.9 |
| 10 | 5.7 | 8.7 |
| 11 | 9 | 6.5 |

It can be understood from Table 2 that the gain step of the gain controlled amplifier 100 is about 3 dB/step, the gain is in the dynamic range of −0.1 dB to 9 dB, and the cutoff frequency is in the range of 13.2 MHz to 6.5 MHz. Also, it can be confirmed that as the gain of the gain controlled amplifier 100 is increased, the cutoff frequency is lowered.

In FIG. 3, Vcc and Vss denote analog power supply voltages of 5V and 1V, respectively. Also, Vp denotes a bias voltage required to drive the operational amplifier 20.

Figure 5:
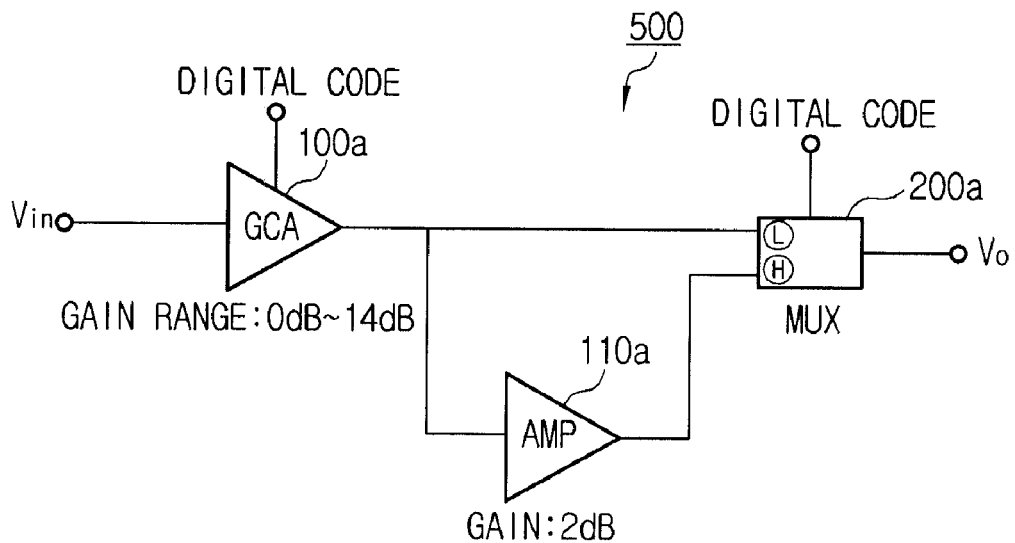
FIG. 5 is a circuit diagram illustrating the construction of a cascoded gain controlled amplifier according to an exemplary embodiment of the present invention, in which a gain controlled amplifier that outputs a gain having a dynamic range and an operational amplifier that outputs a fixed gain are connected in a cascoded manner so as to obtain a gain having a dynamic range of 0 dB to 30 dB.

FIG. 5 is a circuit diagram illustrating a cascoded gain controlled amplifier according to an exemplary embodiment of the present invention, in which a gain controlled amplifier that outputs a gain having a dynamic range and an operational amplifier that outputs a fixed gain are connected in a cascoded manner so as to obtain a gain having a dynamic range of 0 dB to 30 dB.

Referring to FIG. 5, a cascoded gain controlled amplifier 500 includes a first gain controlled amplifier 100a, a first operational amplifier 110a, and a first multiplexer 200a. The internal construction of the first gain controlled amplifier 100a is identical to that of the gain controlled amplifier 100 as illustrated in FIG. 3 and the gain of the first operational amplifier 110a is 2 dB.

The cascoded gain controlled amplifier 500 as illustrated in FIG. 5 is controlled by the digital signal of four bits. The MSB of the digital signal is used to control the first multiplexer 200a, and the three remaining bits are used to control the first gain controlled amplifier 100a.

The first multiplexer 200a outputs the gain of the first gain controlled amplifier 100a according to the MSB of the digital signal of four bits, or outputs the sum of the gain of the first gain controlled amplifier 100a and the gain of the first operational amplifier 110a.

The first gain controlled amplifier 100a outputs the gain having a dynamic range of 0 dB to 14 dB according to the three bits of the digital signal. The gain step of the first gain controlled amplifier 100a is 2 dB/step.

If the MSB is "0", the first multiplexer 200a outputs only the gain of the first gain controlled amplifier 100a. Accordingly, the gain of the cascoded gain controlled amplifier 500 is in the dynamic range of 0 dB to 14 dB.

If the MSB is "1", the first multiplexer 200a outputs the sum of the gain of the first gain controlled amplifier 100a having the dynamic range of 0 dB to 14 dB and the gain of the first operational amplifier 110a having a fixed value of 2 dB. Accordingly, the gain of the cascoded gain controlled amplifier 500 is in the dynamic range of 0 dB to 30 dB. The cascoded gain controlled amplifier 500 according to the present invention can obtain the dynamic range of 0 dB to 30 dB.

Figure 6:
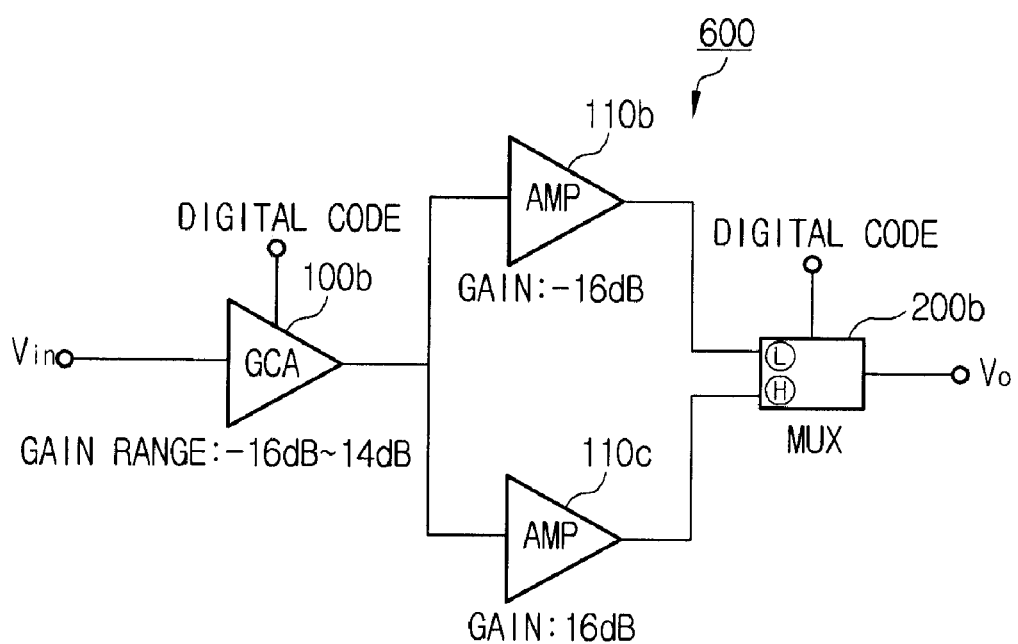
FIG. 6 is a circuit diagram illustrating the construction of a cascoded gain controlled amplifier according to an exemplary embodiment of the present invention, in which a gain controlled amplifier that outputs a gain having a dynamic range and a plurality of operational amplifiers that are connected in parallel to output a fixed gain are connected in a cascoded manner so as to obtain a gain having a dynamic range of −32 dB to 30 dB.

FIG. 6 is a circuit diagram illustrating the construction of a cascoded gain controlled amplifier according to an exemplary embodiment of the present invention, in which a gain controlled amplifier that outputs a gain having a dynamic range and a plurality of operational amplifiers that are connected in parallel to output a fixed gain are connected in a cascoded manner so as to obtain a gain having a dynamic range of −32 dB to 30 dB.

Referring to FIG. 6, a cascoded gain controlled amplifier 600 includes a first gain controlled amplifier 100b, second and third operational amplifiers 110b and 110c connected in parallel, and a multiplexer 200b. The construction of the second gain controlled amplifier 100b is identical to that of the gain controlled amplifier 100 as illustrated in FIG. 3. The gain of the second operational amplifier 110b is 2 dB, and the gain of the third operational amplifier 110c is 16 dB.

The cascoded gain controlled amplifier 600 as illustrated in FIG. 6 is controlled by a digital signal of five bits. The MSB is used to control the second multiplexer 200b, and the four remaining bits are used to control the second gain controlled amplifier 100b.

The second multiplexer 200b outputs the sum of the gain of the second gain controlled amplifier 100b and the gain of the second operational amplifier 110b, or the sum of the gain of the second gain controlled amplifier 100b and the gain of the third operational amplifier 110c.

The second gain controlled amplifier 100b outputs gains having a dynamic range of −16 dB to 14 dB according to the four bits of the digital signal. The gain step of the second gain controlled amplifier 100b is 2 dB/step.

If the MSB is "0", the second multiplexer 200b outputs the sum of the gain of the second gain controlled amplifier 100b having a dynamic range of −16 dB to 14 dB and the gain of the second operational amplifier 110b having a fixed value of −16 dB. In this case, the gain of the cascoded gain controlled amplifier 600 is in the dynamic range of −32 dB to −2 dB.

If the MSB is "1", the second multiplexer 200b outputs the sum of the gain of the second gain controlled amplifier 100b having the dynamic range of −16 dB to 14 dB and the gain of the third operational amplifier 110c having a fixed value of 16 dB. In this case, the gain of the cascoded gain controlled amplifier 600 is in the dynamic range of 0 dB to 30 dB.

Consequently, the cascoded gain controlled amplifier 600 as illustrated in FIG. 6 can obtain the dynamic range of −32 dB to 30 dB according to the digital signal of five bits.

As described above, the gain controlled amplifier according to the present invention employs the R-2R ladder circuit which is controlled by the digital signal so as to obtain a gain that is linearly proportional to a decibel scale. In this case, since the R-2R ladder circuit operates with a small resistance value, the chip size of the gain controlled amplifier can be reduced.

Also, according to the gain controlled amplifier of the present invention, the gain control is performed using only one operational amplifier, and thus the power consumption of the gain controlled amplifier can be reduced.

Also, according to the gain controlled amplifier of the present invention, the gain that is in linear proportion to the decibel scale can be obtained by varying the input resistance and the feedback resistance of the gain controlled amplifier.

Additionally, the cascoded gain controlled amplifier according to the present invention has an advantage in that the gain can be adjusted in the dynamic range of −32 dB to 30 dB, and thus the broadband gain characteristic can be obtained.

The foregoing exemplary embodiments and advantages are merely exemplary and are not to be construed as limiting the present invention. The present teaching can be readily applied to other types of apparatuses. Also, the description of exemplary embodiments of the present invention is intended to be illustrative, and not to limit the scope of the claims, and many alternatives, modifications, and variations will be apparent to those skilled in the art.

What is claimed is:

1. A gain controlled amplifier, comprising:
an operational amplifier including an input terminal and an output terminal;
an input resistor coupled to the input terminal of the operational amplifier;
a feedback resistor coupled to the output terminal of the operational amplifier;
one or more first resistors selectively coupled to the input resistor; and
one or more second resistors selectively coupled to the feedback resistor,
wherein the one or more first resistors are selectively coupled to the input resistor and the one or more second resistors are selectively coupled to the feedback resistor, according to a control signal having respective bits used to control the selective coupling of respective ones of the one or more first and second resistors to the input and feedback resistors.

2. The gain controlled amplifier according to claim 1, wherein the one or more first resistors selectively coupled to the input resistor include a plurality of resistors.

3. The gain controlled amplifier according to claim 1, wherein the one or more second resistors selectively coupled to the feedback resistor include a plurality of resistors.

4. The gain controlled amplifier according to claim 1, wherein the one or more first and second resistors are selectively coupled, respectively, to the input and feedback resistors according a plurality of control signals.

5. The gain controlled amplifier according to claim 4, wherein the control signal is a single control signal.

6. The gain controlled amplifier according to claim 1, wherein the control signal is a digital signal.

7. The gain controlled amplifier according to claim 1, wherein the one or more first resistors and the one or more second resistors are coupled together to form an R-2R ladder circuit configuration.

8. The gain controlled amplifier according to claim 1, wherein each one of the respective bits of the control signal is used to control the selective coupling of a corresponding one of the one or more first and second resistors.

9. The gain controlled amplifier according to claim 1, wherein each one of the respective bits of the control signal is used to control a single particular coupling of one of the first and second resistors.

* * * * *